(12) United States Patent
How et al.

(10) Patent No.: US 8,030,138 B1
(45) Date of Patent: Oct. 4, 2011

(54) METHODS AND SYSTEMS OF PACKAGING INTEGRATED CIRCUITS

(75) Inventors: You Chye How, Melaka Tengah (MY); Shee Min Yeong, Melaka Tengah (MY); Peng Soon Lim, Melaka Tengah (MY); Sek Hoi Chong, Melaka Tengah (MY)

(73) Assignee: National Semiconductor Corporation, Santa Clara, CA (US)

( * ) Notice: Subject to any disclaimer, the term of this patent is extended or adjusted under 35 U.S.C. 154(b) by 918 days.

(21) Appl. No.: 11/484,144

(22) Filed: Jul. 10, 2006

(51) Int. Cl.
*H01L 21/00* (2006.01)

(52) U.S. Cl. ........ 438/126; 438/112; 438/127; 438/464; 257/E21.502; 257/E21.505

(58) Field of Classification Search .......... 438/106, 438/112, 455, 458, 110, 125–127, 464, FOR. 371, 438/FOR. 375, FOR. 379; 257/E21.502, 257/E21.505
See application file for complete search history.

(56) References Cited

U.S. PATENT DOCUMENTS

| | | | |
|---|---|---|---|
| 3,772,064 A | 11/1973 | Mendelson et al. | |
| 4,442,137 A | 4/1984 | Kumar | |
| 5,206,181 A * | 4/1993 | Gross ............................ | 438/18 |
| 5,316,853 A | 5/1994 | Shibata et al. | |
| 5,356,949 A | 10/1994 | Komiyama et al. | |
| 5,597,767 A | 1/1997 | Mignardi et al. | |
| 5,827,394 A | 10/1998 | Lu | |
| 5,923,995 A | 7/1999 | Kao et al. | |
| 5,960,260 A | 9/1999 | Umehara et al. | |
| 5,969,426 A * | 10/1999 | Baba et al. .................... | 257/778 |
| 6,023,094 A | 2/2000 | Kao et al. | |
| 6,175,162 B1 | 1/2001 | Kao et al. | |
| 6,176,966 B1 | 1/2001 | Tsujimoto et al. | |
| 6,214,703 B1 | 4/2001 | Chen et al. | |
| 6,235,366 B1 | 5/2001 | Matsumoto et al. | |
| 6,319,754 B1 | 11/2001 | Wang et al. | |
| 6,383,833 B1 | 5/2002 | Silverbrook | |
| 6,398,892 B1 | 6/2002 | Noguchi et al. | |
| 6,444,310 B1 | 9/2002 | Senoo et al. | |

(Continued)

FOREIGN PATENT DOCUMENTS

JP  54-131537  10/1979

OTHER PUBLICATIONS

U.S. Appl. No. 11/958,288, filed Dec. 17, 2007.

(Continued)

*Primary Examiner* — Matthew Smith
*Assistant Examiner* — Quovaunda V Jefferson
(74) *Attorney, Agent, or Firm* — Beyer Law Group LLP (57) ABSTRACT

Panel level methods and systems for packaging integrated circuits are described. In a method aspect of the invention, a substrate formed from a sacrificial semiconductor wafer is provided having a plurality of metallized device areas patterned thereon. Each device area includes an array of metallized contacts and a die attach area. Dice are mounted onto each device area and electrically connected to the array of contacts. The entire surface of the substrate including the dice, contacts and electrical connections is then encapsulated. The semiconductor wafer is then sacrificed leaving portions of the contacts exposed allowing the contacts to be used as external contacts in an IC package. In various embodiments, other structures, including die attach pads, may be incorporated into the device areas as desired. By way of example, structures having thicknesses in the range of 10 to 20 microns are readily attainable.

17 Claims, 6 Drawing Sheets

U.S. PATENT DOCUMENTS

| | | | |
|---|---|---|---|
| 6,610,167 B1 | 8/2003 | Glenn et al. | |
| 6,623,594 B1 | 9/2003 | Yamamoto et al. | |
| 6,702,910 B2 | 3/2004 | Noguchi et al. | |
| 6,709,953 B2 | 3/2004 | Vasquez et al. | |
| 6,797,541 B2 * | 9/2004 | Chun et al. | 438/111 |
| 6,812,552 B2 | 11/2004 | Islam et al. | |
| 6,821,821 B2 * | 11/2004 | Fjelstad | 438/124 |
| 6,858,919 B2 | 2/2005 | Seo et al. | |
| 6,873,032 B1 | 3/2005 | McCann et al. | |
| 6,873,059 B2 | 3/2005 | Amagai et al. | |
| 6,943,434 B2 | 9/2005 | Tangpuz et al. | |
| 6,953,988 B2 | 10/2005 | Seo et al. | |
| 6,964,881 B2 * | 11/2005 | Chua et al. | 438/108 |
| 6,967,125 B2 | 11/2005 | Fee et al. | |
| 7,009,286 B1 * | 3/2006 | Kirloskar et al. | 257/684 |
| 7,018,844 B2 * | 3/2006 | Yagi et al. | 436/106 |
| 7,095,096 B1 | 8/2006 | Mostafazadeh | |
| 7,160,755 B2 * | 1/2007 | Lo et al. | 438/106 |
| 7,208,335 B2 * | 4/2007 | Boon et al. | 438/33 |
| 7,244,664 B2 * | 7/2007 | Blair et al. | 438/460 |
| 7,268,012 B2 * | 9/2007 | Jiang et al. | 438/106 |
| 7,507,603 B1 | 3/2009 | Berry et al. | |
| 7,749,809 B2 * | 7/2010 | How et al. | 438/110 |
| 7,955,953 B2 * | 6/2011 | Lo et al. | 438/464 |
| 2003/0143819 A1 | 7/2003 | Hedler et al. | |
| 2003/0197267 A1 * | 10/2003 | Lee et al. | 257/734 |
| 2004/0058478 A1 * | 3/2004 | Islam et al. | 438/123 |
| 2004/0104491 A1 | 6/2004 | Connell et al. | |
| 2004/0106233 A1 | 6/2004 | Lin et al. | |
| 2004/0161876 A1 | 8/2004 | Tandy et al. | |
| 2004/0191510 A1 | 9/2004 | Kiuchi et al. | |
| 2005/0067680 A1 * | 3/2005 | Boon et al. | 257/678 |
| 2005/0070095 A1 | 3/2005 | Sharan et al. | |

OTHER PUBLICATIONS

U.S. Appl. No. 11/691,428, filed Mar. 26, 2007.
Office Action in U.S. Appl. No. 11/958,288, mailed Nov. 20, 2009.

* cited by examiner

METHODS AND SYSTEMS OF PACKAGING INTEGRATED CIRCUITS

FIELD OF THE INVENTION

The present invention relates generally to the packaging of integrated circuits. More particularly, the invention relates to panel level arrangements and methods for packaging semiconductor dice using a wafer as a substrate panel.

BACKGROUND

There are a number of conventional processes for packaging integrated circuits. Many packaging techniques use a leadframe that has been stamped or etched from a metal (typically copper) sheet to provide electrical interconnects to external devices. One relatively recently developed packaging style is a leadless leadframe package (LLP) (also referred to as a quad flat pack—no leads (QFN) package). In a leadless leadframe package, the leadframe typically includes an array of contacts that are exposed on the bottom surface of the package. The LLP may also include lead traces that may or may not be exposed at the bottom surface of the package.

A die mounted on the leadframe is wire bonded (or otherwise electrically connected) to the contacts and/or the lead traces, the lead traces serving as electrical connectors between the bonding wires and associated contacts. Often the LLP will have a die support structure upon which the die is mounted. After the dice are attached to the leadframe panel, an encapsulant material is often used to encapsulate the entire device area including the die, wire bonds, contacts and/or lead traces such that the encapsulated structures remain rigidly fixed.

A notable advantage of such an LLP arrangement is that the integrated circuit device package can be made to have a substantially smaller footprint than that obtainable with conventional leadframes.

LLP packages in general have generated a great deal of interest within the semiconductor industry. Although existing techniques for fabricating LLPs and for packaging integrated circuits using LLP technology work well, there are continuing efforts to develop even more efficient designs and methods for packaging integrated circuits.

SUMMARY

To achieve the foregoing and other objects of the invention, improved arrangements and processes for packaging integrated circuits are described. In particular, panel level methods and systems for packaging integrated circuits are described.

In one aspect of the invention, a substrate formed from a sacrificial semiconductor wafer is utilized in the packaging of integrated circuit dice. The wafer is metallized to define a plurality of device areas. Each device area includes a die attach area and an array of metallized electrically isolated contacts that are not electrically connected to any circuits within the wafer. A plurality of dice are then attached to the substrate, wherein each die is mounted on an associated device area. The device area may or may not include a die attach pad or other such die support structure. The dice are then electrically connected to the associated array of contacts on their associated device areas. These contacts serve as electrical connections to external devices. In many embodiments, the first surface of the substrate is then covered with an encapsulant such that the encapsulant encapsulates the dice, the contacts and the electrical connections such that these structures remain rigidly fixed relative to one another. The semiconductor material of the wafer is then sacrificed leaving the contacts exposed and suitable for use as electrical connections to external devices. The semiconductor material of the wafer may be sacrificed by any suitable means. In the preferred embodiment, the wafer is background until the contacts are exposed. In other embodiments, the wafer may even be background until a few microns of the contacts are ground away thus providing more assurance that all of the contacts are exposed. The encapsulation material rigidly holds the plurality of device areas together after the semiconductor material of the wafer has been sacrificed.

The exposed contacts may then be solder plated if desired. The die packages may then be laser marked and the dice electrically tested prior to singulation. The device areas may then be singulated by sawing, laser cutting or other suitable means, thereby providing a plurality of singulated integrated circuit packages.

In an apparatus aspect of the invention, a sacrificial semiconductor wafer substrate suitable for use in the packaging of integrated circuit dice is formed. The wafer substrate includes a plurality of metallized device areas patterned on a first surface of the wafer. In many embodiments, the metallized device areas are formed from one or more thin films of metal that are deposited onto the surface of the wafer and later etched to define a desired pattern. Each device area consists essentially of an array of metallized electrically isolated contacts that are not electrically connected to any circuits within the wafer and a die attach area suitable for the mounting of an associated die. The exposed surfaces of the contacts are suitable for wire bonding to electrically connect the contacts to their associated die. Contacts having thickness in the range of approximately 10 to 20 microns are readily attainable. However, the thicknesses of the contacts may be varied as appropriate for a particular application. In the described embodiment, the device areas are arranged into a two-dimensional array of immediately adjacent device areas that are defined by a grid of sacrificial metallized saw streets that serve as marker lines indicating where the device areas are to be sawed or otherwise singulated. In some embodiments, each device area may further comprise a metallized die attach pad or other such die support structure in its associated die attach area.

In another apparatus aspect of the invention, a panel suitable for use in the packaging of integrated circuits is described. The panel includes a metallized sacrificial wafer substrate. The substrate includes a plurality of metallized device areas patterned on a first surface of the wafer. Each device area includes a die attach area and an array of metallized electrically isolated contacts that are not electrically connected to any circuits within the wafer. In the described embodiment, the device areas are arranged into a two-dimensional array of immediately adjacent device areas that are defined by a grid of sacrificial metallized saw streets that serve as marker lines indicating where the device areas are to be sawed or otherwise singulated. Each device area may further comprise a metallized die attach pad or other such die support structure in its associated die attach area. A plurality of dice are attached to the substrate, each die being mounted on an associated die attach area of an associated device area. A plurality of bonding wires electrically connects each die to the associated array of contacts in an associated device area. The contacts are suitable for use as external package contacts after the semiconductor material of the wafer is sacrificed. The panel also includes an encapsulant layer that covers a first surface of the substrate and encapsulates the dice, the contacts and the bonding wires such that the encapsulation material rigidly holds the plurality of device areas together after the semiconductor material of the wafer has been sacrificed.

The advantages of such arrangements and methods are significant. Firstly, costs are potentially reduced since packaging may be performed on a greater scale on a panel level. Secondly, having thinner contacts and die attach pads leads to better thermal performance. Lastly, higher throughput is expected with such panel level arrangements and methods.

BRIEF DESCRIPTION OF THE DRAWINGS

The invention, together with further objects and advantages thereof, may best be understood by reference to the following description taken in conjunction with the accompanying drawings in which.

In the drawings, like reference numerals designate like structural elements. Also, it should be understood that the depictions in the figures are not to scale.

DETAILED DESCRIPTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring the present invention.

Figure 1:
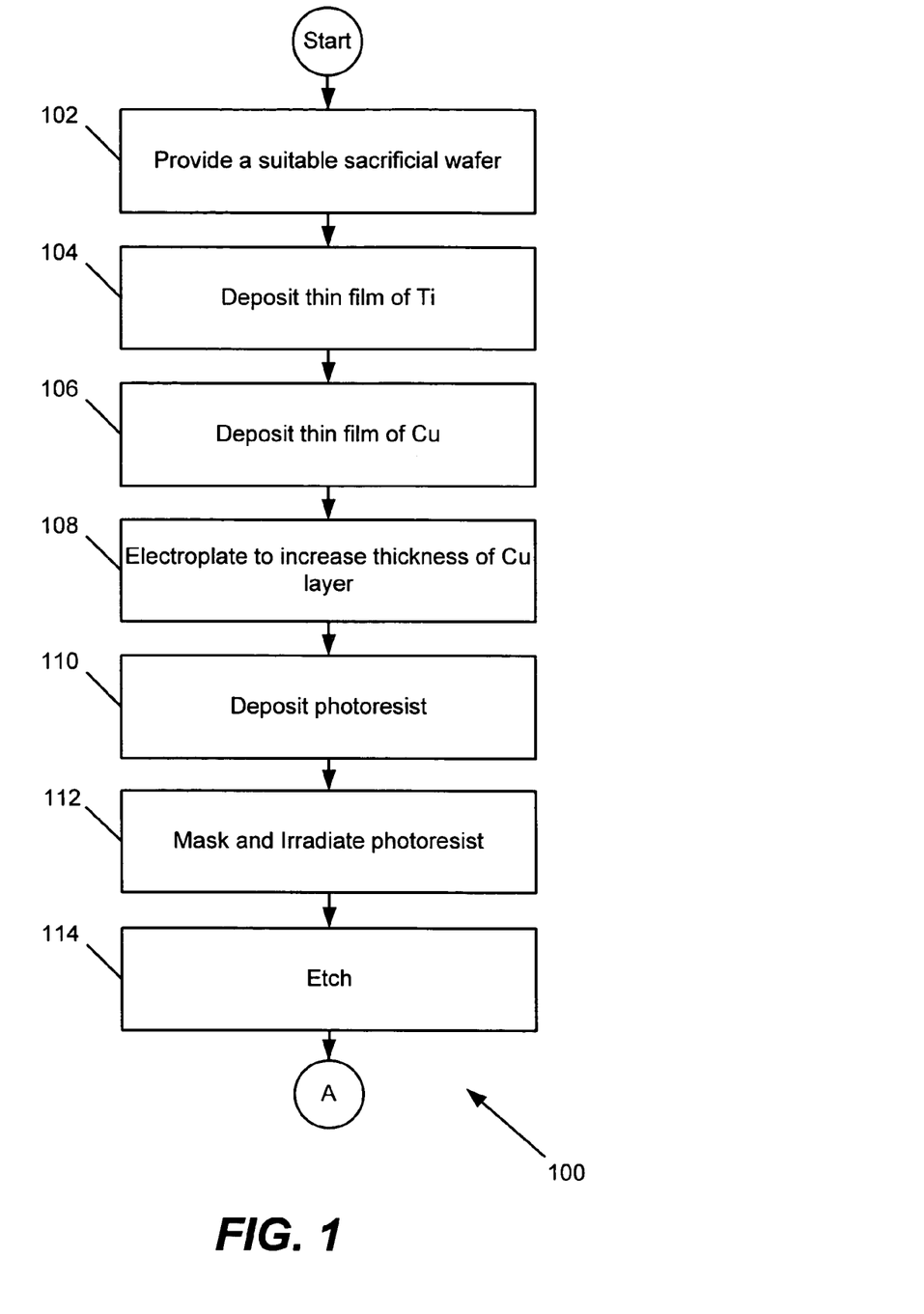
FIG. 1 shows a flowchart illustrating a process of constructing a metallized sacrificial wafer substrate suitable for use in the packaging of integrated circuits in accordance with one embodiment of the present invention.
Figure 2A:
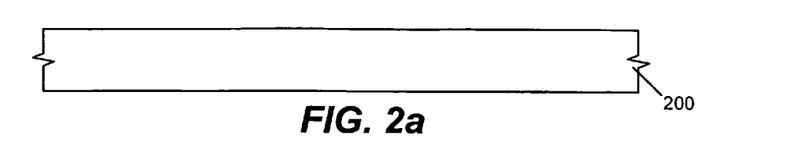
FIG. 2(a) illustrates a diagrammatic cross section of a semiconductor wafer suitable for use in a sacrificial wafer substrate in accordance with one embodiment of the present invention.
Figure 2B:
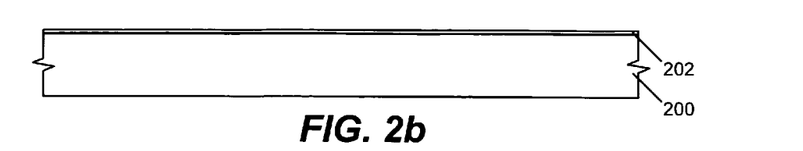
FIG. 2(b) illustrates the diagrammatic cross section of FIG. 2(a) having a thin film of titanium deposited thereon in accordance with one embodiment of the present invention.

Referring initially to FIG. 1, and further in view of FIGS. 2(a)-2(f) and 3(a)-3(b), a process 100 of constructing a sacrificial wafer substrate suitable for use in the packaging of integrated circuits in accordance with one embodiment of the present invention will be described. Initially, in step 102, a suitable sacrificial wafer 200 is provided. In the preferred embodiment, the wafer is a semiconductor wafer formed from a semiconductor material such as silicon. In order to prepare the wafer for use as a substrate, the wafer is first metallized. A wide variety of metallization techniques can be used to metallize the wafer. In the initially described embodiments, a thin film of titanium 202 is initially deposited onto the front (top) surface of the sacrificial wafer 200 as is illustrated in FIG. 2(b). Next, a thin film of copper 204 is deposited onto the thin film of titanium 202 in step 106. It should be noted that a copper alloy or any other suitable conducting material may be used in place of the copper. The titanium film 202 is sufficiently thick to serve as a barrier against copper migration. As is well known in the art, titanium films are often employed as barriers against copper poisoning, whereby copper migrates into a semiconductor wafer. In the described embodiment, the thin metallic films are deposited by sputtering, although other methods may be used, such as thermal evaporation, electroplating, or any other suitable method by which a thin uniform metallic film may be deposited with an accurately controlled thickness.

Figure 2C:
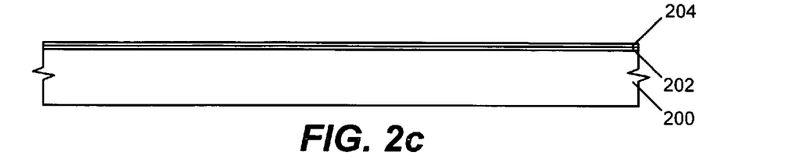
FIG. 2(c) illustrates the diagrammatic cross section of FIG. 2(b) having a thin film of copper deposited thereon in accordance with one embodiment of the present invention.

FIG. 2(c) shows the sacrificial wafer 200 with the copper film 204 deposited onto the titanium film 202. In step 108, the copper film 204 is electroplated to further grow the copper film to a desired thickness. It should be noted that the electroplating is not necessary if the copper film 204 that is originally deposited is already of the desired thickness. The copper film is generally grown to a thickness in the range of approximately 10 to 20 microns. However, both thicker and thinner films are readily attainable and may be used to meet the needs of any particular package.

Figure 2D:
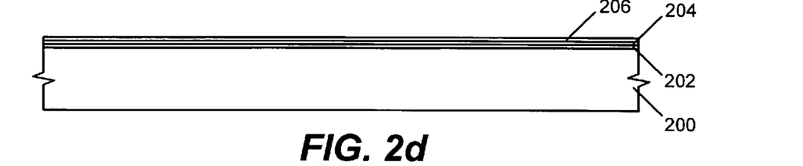
FIG. 2(d) illustrates the diagrammatic cross section of FIG. 2(c) having a thin film of photoresist deposited thereon in accordance with one embodiment of the present invention.
Figure 2E:
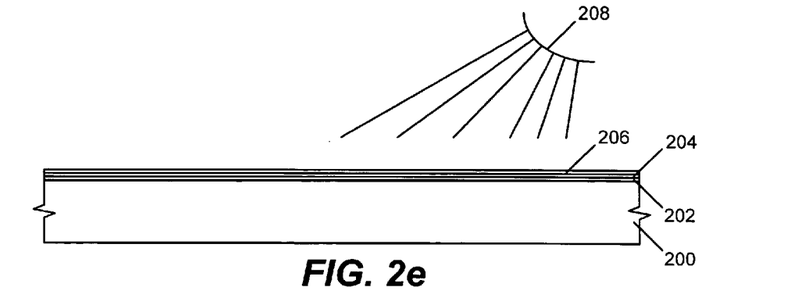
FIG. 2(e) illustrates the diagrammatic cross section of FIG. 2(d) being irradiated by a light source in accordance with one embodiment of the present invention.
Figure 3A:
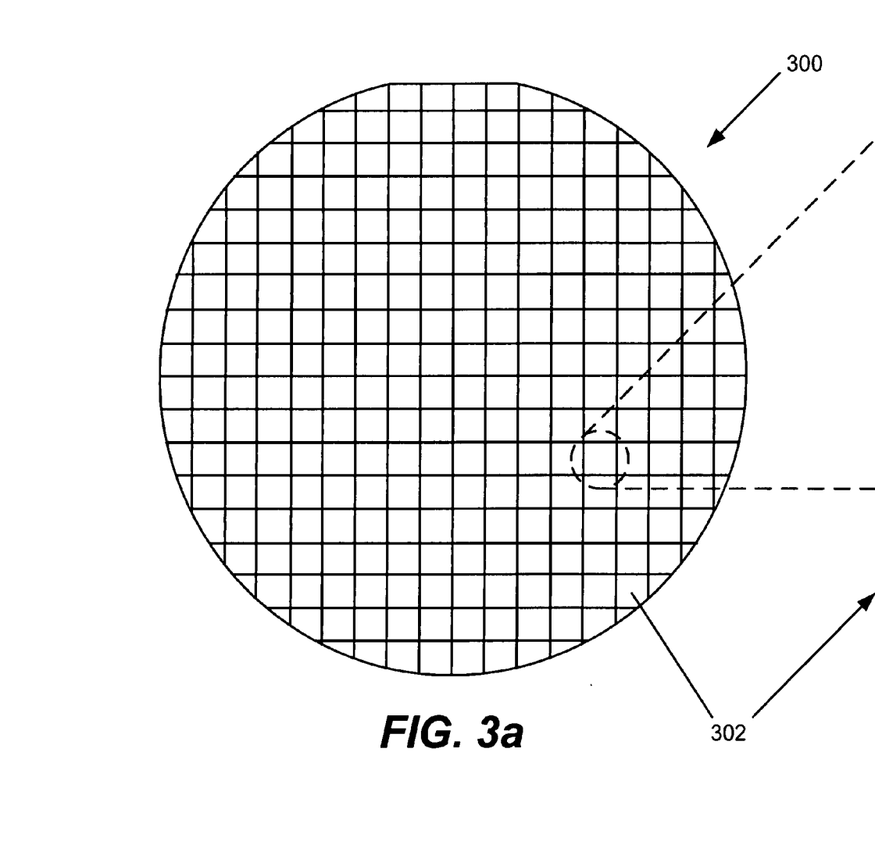
FIG. 3(a) illustrates the top (front) surface of a metallized sacrificial wafer substrate having a plurality of metallized device areas patterned thereon in accordance with one embodiment of the present invention.
Figure 3B:
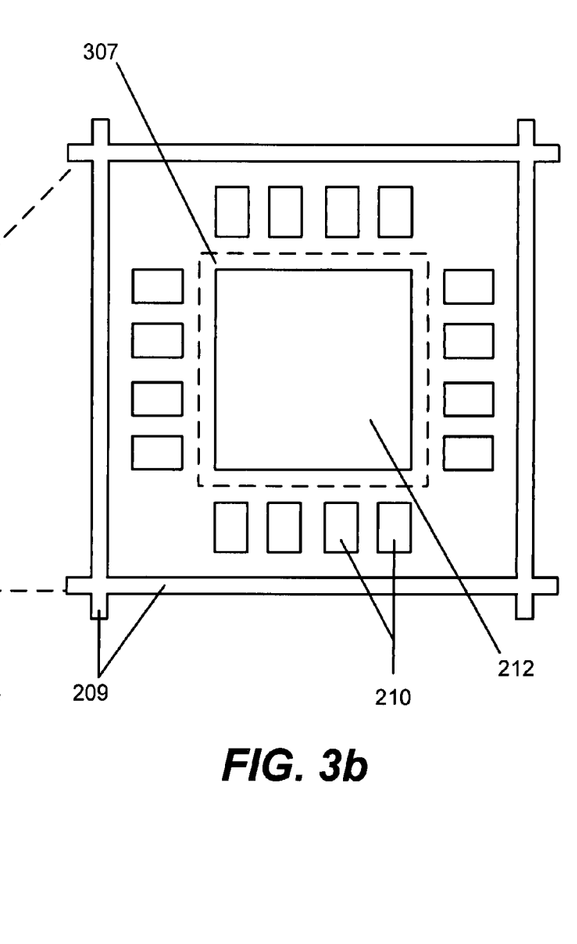
FIG. 3(b) illustrates a magnified view of one device area of FIG. 3(a) in accordance with one embodiment of the present invention.

After the metallization has been applied to the wafer, it is patterned to define a multiplicity of device areas 302 suitable for use in the packaging of integrated circuits, as is illustrated in FIG. 3(b). A wide variety of conventional patterning techniques can be used to pattern the wafer appropriately. By way of example, in the described embodiment, a photoresist 206 is subsequently deposited onto the copper film 204 in step 110. FIG. 2(d) illustrates the photoresist 206 deposited on top of the copper film 204. The photoresist 206 may be a positive photoresist, whereby the portion of the photoresist that is exposed to light becomes soluble to a photoresist developer, or a negative photoresist, whereby the portion of the photoresist that is unexposed to light becomes soluble and is dissolved by a photoresist developer. In step 112, the photoresist 206 is masked according to a desired pattern and irradiated with a light source 208, as is illustrated in FIG. 2(e). In step 114, the photoresist 206 is then exposed to the photoresist developer and the metallic films 202 and 204 are etched. It should be noted that other suitable means of patterning and etching may be used as well. The etched pattern defines a plurality of device areas 302 suitable for use in the packaging of integrated circuits.

Figure 2F:
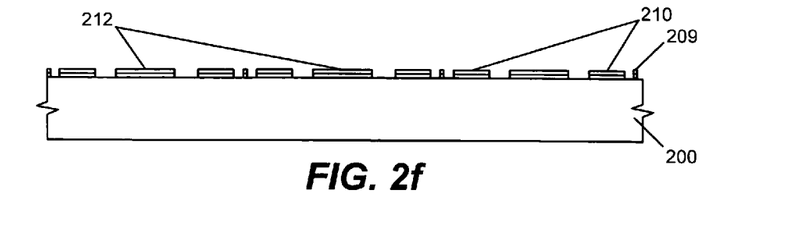
FIG. 2(f) illustrates the diagrammatic cross section of FIG. 2(e) after exposure to a photoresist developer, and further illustrates a plurality of device areas in accordance with one embodiment of the present invention.

Referring to FIGS. 3(a)-3(b), a metallized substrate 300 suitable for use as a sacrificial substrate in the packaging of integrated circuits according to one embodiment of the present invention will be described. In the described embodiment, a plurality of metallized device areas 302 are organized into a two-dimensional array on one surface of a sacrificial wafer. Each device area 302 includes a die attach area 307 suitable for mounting an integrated circuit die and an array of electrically isolated metallized contacts 210 suitable for use as electrical interconnects to external devices once the IC die is packaged, as is illustrated in FIGS. 2(f) and 3(b). The die attach area 307 may or may not also include a metallized die attach pad 212.

It should be appreciated that the underlying sacrificial wafer eliminates the need for the use of tie bars and/or other structures to support the contacts and various other features as is required in conventional leadframes. Eliminating the tie bars and various other supporting structures potentially permits the device areas to be packed more tightly as well as allowing for thinner packages. By way of example, based on a 2×2 mm package size, approximately 750 such packages may be formed from a standard leadframe strip whereas approximately 3750 units may be formed from a 6 in diameter wafer and approximately 6700 units may be formed from an 8 in diameter wafer.

The metallized contacts 210 illustrated in FIGS. 2(f) and 3(b) are arranged in a grid array having a single row (in the context of this discussion a "row" extends along all four sides of the device). Of course, the size of the grid array can be widely varied depending upon the needs of a particular application, and as will be appreciated by those familiar with the art, the grid array can include additional rows as well as additional metallized lead traces coupled to contacts. Interior rows and lead traces may even serve as a die support structure. In this way, a package resembling a microarray package may even be formed. Furthermore, in the described embodiment, the metallic film pattern also includes a grid of metallized sacrificial saw streets 209 that serve as boundaries between the adjacent device areas 302. The metallized sacrificial saw streets 209 are called as such because they serve as marker lines indicating where the device areas 302 are to be sawed or singulated.

Figure 3C:
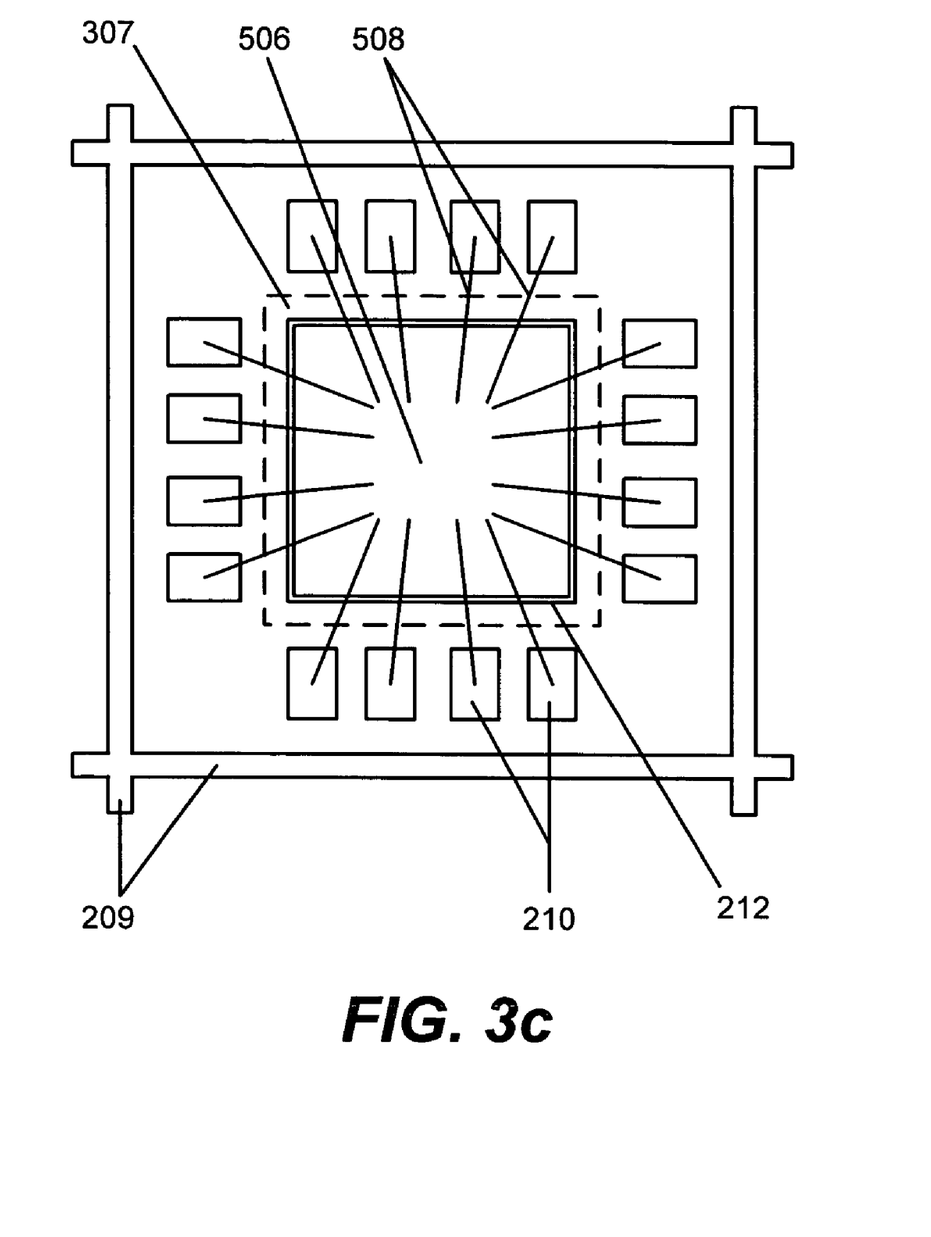
FIG. 3(c) illustrates a magnified view of one device area of FIG. 3(a) having a die mounted and electrically connected thereon in accordance with one embodiment of the present invention
Figure 4:
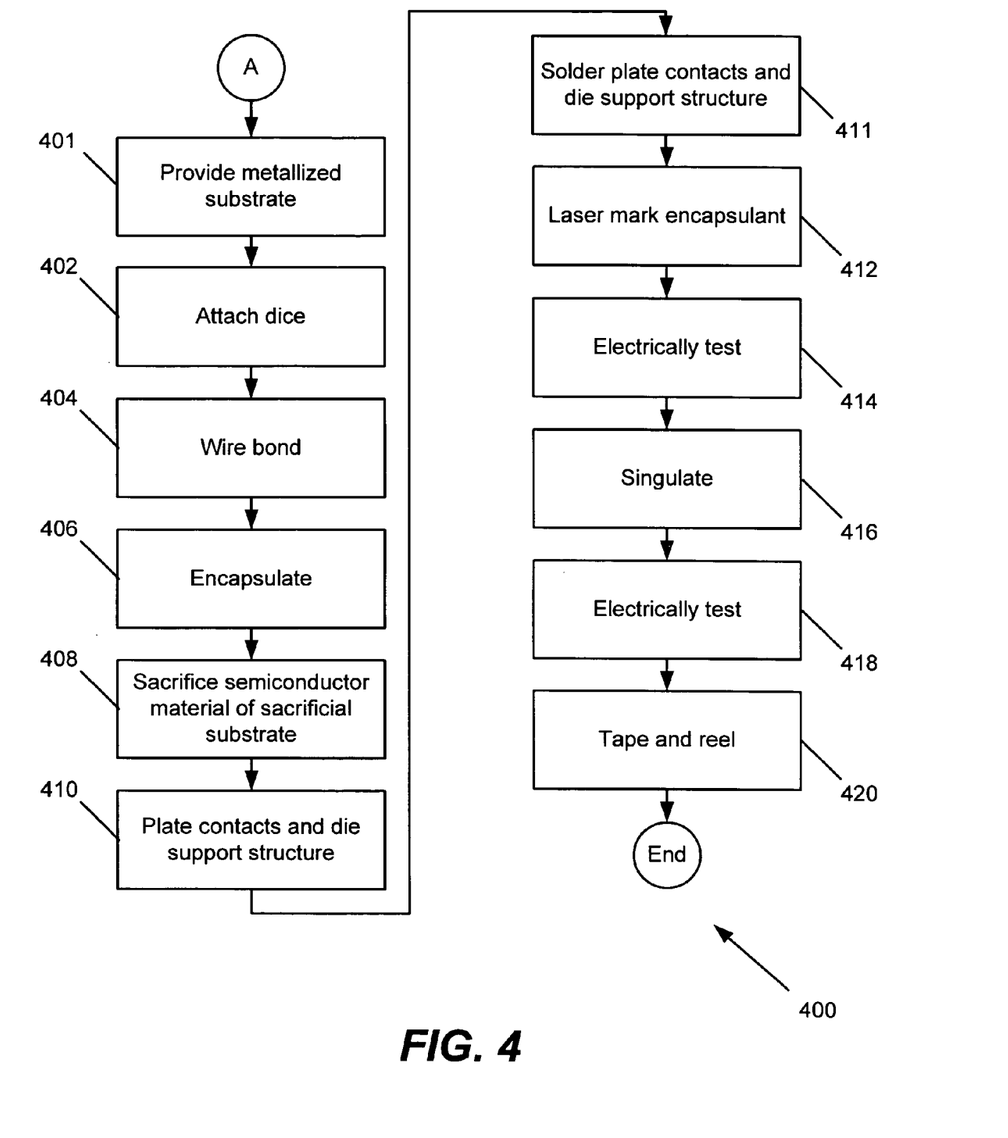
FIG. 4 shows a flowchart illustrating a process of packaging integrated circuits using a metallized sacrificial wafer substrate in accordance with one embodiment of the present invention.
Figure 5A:
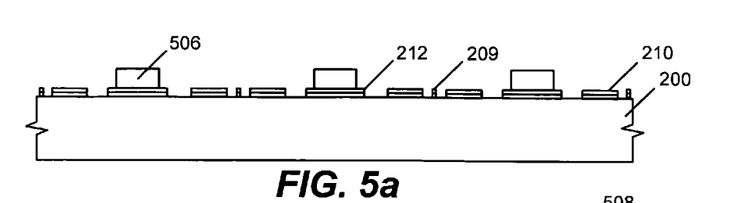
FIG. 5(a) illustrates the diagrammatic cross section of FIG. 2(f) after a plurality of dice has been attached thereon in accordance with one embodiment of the present invention.

Referring now to FIG. 4, and further in view of FIGS. 5(a)-5(e) and 3(c), a process 400 for packaging integrated circuits using a metallized sacrificial wafer substrate according to one embodiment of the present invention will be described. In the described embodiment, the metallized substrate 300 is provided in step 401. A plurality of integrated circuit dice 506 are attached to the metallized substrate 300 in step 402 using conventional die attach techniques. This is illustrated in FIGS. 5(a) and 3(c), wherein each die 506 is mounted onto an associated die attach area 307. By way of example an adhesive paste or an adhesive tape can be used to secure the dice 506 to the die attach area. In the described embodiment, the die 506 is mounted onto a metallized die attach pad 212 located within the die attach area 307 of the associated device area 302. The die attach pad provides a means of electrically connecting the die substrate to external devices, as well as a means of connecting the die to a heat sink, among others. In other embodiments, the die attach pad 212 may be replaced with some other suitable die support structure, such as an array of metallized contacts or lead traces. In still other embodiments, the die attach area 307 may not include any such die support structure at all.

Figure 5B:
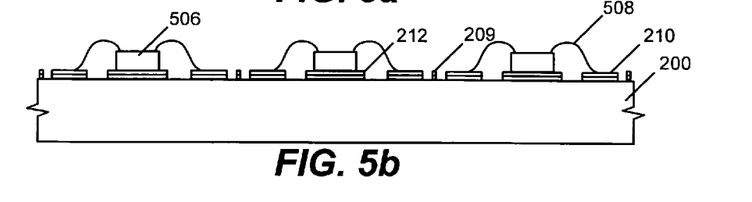
FIG. 5(b) illustrates the diagrammatic cross section of FIG. 5(a) after the plurality of dice has been electrically connected to the device areas in accordance with one embodiment of the present invention.

The dice 506 are then electrically connected to selected contacts 210 on their associated device areas 302 in step 404, as is illustrated in FIGS. 5(b) and 3(c). In the described embodiment, wire bonds 508 serve as the electrical connections between the contacts 210 and the dice 506.

Figure 5C:
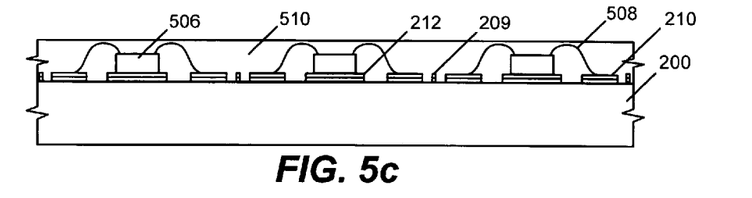
FIG. 5(c) illustrates the diagrammatic cross section of FIG. 5(b) after the device areas have been encapsulated in accordance with one embodiment of the present invention.

In step 406, the front surface of the metallized substrate 300 is then covered with an encapsulant 510 such that the encapsulant 510 encapsulates the dice 506, the contacts 210 and the wire bonds 508, as is best illustrated in FIG. 5(c). In the illustrated embodiment, the encapsulant 510 is molded over the entire two-dimensional array of device areas. However, a variety of other known encapsulation techniques such as glob topping, screen printing, or stencil printing may be used to encapsulate the device areas. Generally, it is desirable for the encapsulant to cover all of the device areas so that when the semiconductor material of the metallized substrate 300 is later sacrificed, the encapsulant material will hold all of the devices together. However, in other embodiments, the device areas could be individually encapsulated (e.g., by using a mold having an array of cavities that are designed to match the device areas), or group molded in several different blocks (e.g., with each block having a two dimensional array of device areas).

Figure 5D:
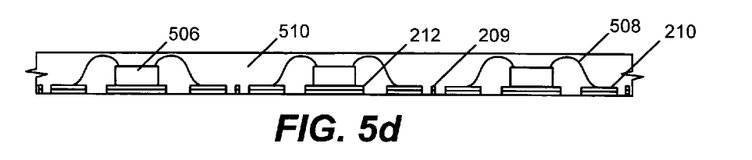
FIG. 5(d) illustrates the diagrammatic cross section of FIG. 5(c) after the wafer has been sacrificed in accordance with one embodiment of the present invention.

The semiconductor material of the metallized sacrificial substrate 300 is then sacrificed in step 408 leaving the metallized contacts 210 exposed, as is illustrated in FIG. 5(d). Removing the semiconductor material leaves the metallized contacts suitable for use as electrical connections to external devices. The semiconductor material may be sacrificed by any suitable means. In the preferred embodiment, the semiconductor material is subjected to a backgrind operation until the contacts 210 are exposed. In some embodiments, the backgrind operation may continue until a few microns of the contacts 210 themselves are ground away, thus providing more assurance that all of the contacts 210 are exposed.

Figure 5E:
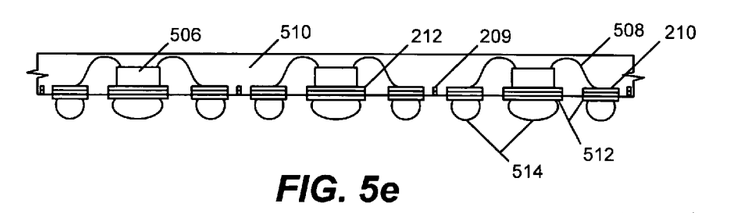
FIG. 5(e) illustrates the diagrammatic cross section of FIG. 5(d) after solder plating and bumping in accordance with one embodiment of the present invention.
Figure 5F:
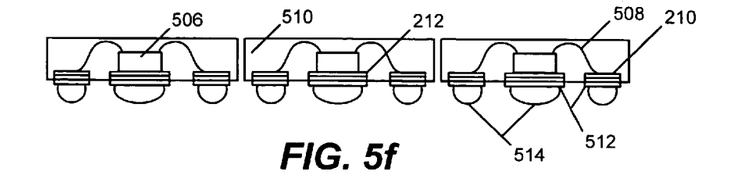
FIG. 5(f) illustrates the diagrammatic cross section of FIG. 5(e) after the device areas have been singulated in accordance with one embodiment of the present invention.

It may often be desirable to form solder bumps 514 on each of the contacts 210 (i.e., bump the devices) while still at this "panel" level. In the described embodiment, both the contacts 210 and the die attach pads 212 are solder plated. As mentioned above, the metallized contacts 210 and die attach pads 212 are generally formed from a material such as copper that corrodes when exposed to ambient air and/or does not adhere well to certain solders. Therefore, as will be appreciated by those familiar with packaging in general, in some situations, it may also be desirable to plate the contacts 210 by applying one or more metallization layers 512 onto the contacts 210 prior to solder plating. By way of example, lead or lead-based alloys work well. This plating is carried out in step 410 and is illustrated in FIG. 5(e). The plated contacts 210 may then be solder plated in step 411.

In many embodiments, the encapsulant material 510 associated with each device area 302 may then be laser marked at the panel level in step 412. One particularly noticeable feature of the described panel is that after the semiconductor material of the metallized substrate 300 has been removed, the device areas are typically not electrically connected. Therefore, the device areas may also be tested in panel form, step 414, which is advantageous from a cost standpoint. In step 416, the device areas 302 may then be singulated by sawing, laser cutting or other suitable means, thereby providing a plurality of singulated integrated circuit packages. It should be noted that the metallized saw streets 209 are typically substantially obliterated during device singulation. However, in contrast to conventional leadframes, the small thickness of the saw streets 209 (approximately 10 to 20 microns), as compared to conventional leads (approximately 100 to 200 microns), allows for much improved saw blade life. After device singulation, the IC packages may then be electrically tested again in step 418. This second round of testing is advantageous as the process of singulation is potentially capable of breaking the electrical bonds. Subsequently, the singulated packages may be taped and reeled in step 420.

It should be appreciated that the small thickness of the contacts 210 and various other structures means less metal is required. Moreover, this means that the contacts 210 and various other structures, themselves, on the metallized substrate 300 won't necessarily be the constraint determining the resultant package thickness. By way of example, the die 506 may be directly placed onto the semiconductor material of the substrate 300 in the region of the die attach area 307.

Although only a few embodiments of the invention have been described in detail, it should be appreciated that the invention may be implemented in many other forms without departing from the spirit or scope of the invention. Although specific IC packaging features have been described (such as contacts and die attach structures), it should be appreciated that a wide variety of packaging structures can be created using the described wafer level approach. The described thin film deposition approach can be used to produce IC packaging features having virtually any desired footprint. Thus, the geometry of the contacts and other structures as well as the layout of such structures may be varied as appropriate for a particular application. For example, in the illustrated embodiments, the contacts have a substantially rectangular footprint. However, in other embodiments, alternative cross section geometries, such as square, round or oval footprints may be formed. Accordingly, the present embodiments are to be considered as illustrative and not restrictive and the invention is not to be limited to the details given herein, but may be modified within the scope of the appended claims.

The invention claimed is:

1. A method of packaging integrated circuits comprising:
providing a substrate formed from a sacrificial semiconductor wafer, the substrate having a first surface including a plurality of device areas, wherein each device area includes a die attach area and an array of non-solder metallized electrically isolated contacts that are not electrically connected to any circuits within the wafer;
attaching a plurality of dice to the substrate, wherein each die is mounted on an associated device area;
electrically connecting the dice to selected contacts on their associated device areas;
encapsulating the first surface of the substrate, the dice, the contacts and the electrical connections; and
sacrificing the semiconductor material of the sacrificial semiconductor wafer after the encapsulation leaving at least portions of the contacts exposed to serve as electrical contacts for their associated dice, wherein the encapsulation material holds the plurality of device areas together after the semiconductor material of the sacrificial semiconductor wafer has been sacrificed, wherein the sacrificing of the sacrificial semiconductor wafer is performed by backgrinding the sacrificial semiconductor wafer until the sacrificial semiconductor wafer is completely removed and at least a portion of the contacts are exposed.

2. A method as recited in claim 1 further comprising solder plating the exposed contacts.

3. A method as recited in claim 1 further comprising:
singulating the device areas to form a multiplicity of die packages; and
laser marking each package prior to singulation.

4. A method as recited in claim 1 further comprising electrical testing the dice prior to singulating the device areas.

5. A method as recited in claim 1 further comprising singulating the device areas, thereby providing a plurality of singulated integrated circuit packages.

6. A method as recited in claim 1 wherein:
the metalized electrically isolated contacts are not made of solder; and
the array of metalized electrically isolated contacts is formed over a surface of the substrate and does not extend below the surface and into the substrate.

7. A method as recited in claim 6, wherein:
the sacrificial semiconductor wafer has a substantially uniform composition; and
the array of metalized electrically isolated contacts are formed directly on the surface of the substrate.

8. A method of packaging integrated circuits comprising:
providing a substrate formed from a sacrificial semiconductor wafer, the substrate having a first surface including a plurality of device areas, wherein each device area includes a die attach area and an array of non-solder metallized electrically isolated contacts that are not electrically connected to any circuits within the wafer;
attaching a plurality of dice to the substrate, wherein each die is mounted on an associated device area;
electrically connecting the dice to selected contacts on their associated device areas;
encapsulating the first surface of the substrate, the dice, the contacts and the electrical connections; and
sacrificing the semiconductor material of the sacrificial semiconductor wafer after the encapsulation leaving at least portions of the contacts exposed to serve as electrical contacts for their associated dice, wherein the encapsulation material holds the plurality of device areas together after the semiconductor material of the sacrificial semiconductor wafer has been sacrificed, wherein the sacrificing of the sacrificial semiconductor wafer is performed by backgrinding the sacrificial semiconductor wafer until at least a portion of the contacts are exposed;
wherein the backgrinding is performed until at least 1 micron of the contacts are ground away.

9. A method of packaging integrated circuits comprising:
providing a substrate formed from a sacrificial semiconductor wafer having a substantially uniform composition, the substrate having a first surface including a plurality of device areas, wherein each device area includes a die attach area and an array of non-solder metallized electrically isolated contacts that are not electrically connected to any circuits within the wafer;
the array of metalized electrically isolated contacts not extending below the first surface and into the substrate;
attaching a plurality of dice to the substrate, wherein each die is mounted on an associated device area;
electrically connecting the dice to selected contacts on their associated device areas;
encapsulating the first surface of the substrate, the dice, the contacts and the electrical connections; and
sacrificing the semiconductor material of the sacrificial semiconductor wafer after the encapsulation leaving at least portions of the contacts exposed to serve as electrical contacts for their associated dice, wherein the encapsulation material holds the plurality of device areas together after the semiconductor material of the sacrificial semiconductor wafer has been sacrificed, wherein the sacrificing of the sacrificial semiconductor wafer is performed by backgrinding the sacrificial semiconductor wafer until the sacrificial semiconductor wafer is completely removed leaving the contacts exposed.

10. The method of claim 9, wherein the array of metalized electrically isolated contacts are formed directly onto the substrate.

11. A method as recited in claim 10 wherein:
the metalized electrically isolated contacts are not made of solder; and
the array of metalized electrically isolated contacts is formed over a surface of the substrate and does not extend below the surface and into the substrate.

12. A method as recited in claim 11, wherein:
the array of metalized electrically isolated contacts are formed directly on the surface of the substrate.

13. A method of packaging integrated circuits comprising:
providing a substrate formed from a sacrificial semiconductor wafer; the substrate having a first surface, the a first surface including a plurality of device areas, wherein each device area includes a die attach area and an array of non-solder metallized electrically isolated contacts formed on a substantially planar surface with the array of non-solder metalized electrically isolated contacts not electrically connected to any circuits within the wafer;
attaching a plurality of dice to the substrate, wherein each die is mounted on an associated device area;
electrically connecting the dice to selected contacts on their associated device areas;
encapsulating the first surface of the substrate, the dice, the contacts and the electrical connections; and
sacrificing the semiconductor material of the sacrificial semiconductor wafer after the encapsulation leaving at least portions of the contacts exposed to serve as electrical contacts for their associated dice, wherein the encapsulation material holds the plurality of device areas together after the semiconductor material of the sacrificial semiconductor wafer has been sacrificed, wherein the sacrificing of the sacrificial semiconductor wafer is performed by backgrinding the sacrificial semiconductor wafer until the sacrificial semiconductor wafer is completely removed and at least a portion of the contacts are exposed.

14. The method of claim 13, wherein the sacrificing of the sacrificial semiconductor wafer is performed by backgrinding the sacrificial semiconductor wafer through the sacrificial substrate and into the surface of the encapsulation layer so that the contacts are exposed.

15. The method of claim 14, wherein the sacrificial semiconductor wafer has a substantially uniform composition.

16. A method of packaging integrated circuits comprising:
providing a substrate formed from a sacrificial semiconductor wafer having a substantially uniform composition, the substrate having a first surface including a plurality of device areas, wherein each device area includes a die attach area and an array of non-solder metallized electrically isolated contacts that are not electrically connected to any circuits within the wafer, the array of metalized electrically isolated contacts not extending below the first surface and into the substrate;
attaching a plurality of dice to the substrate, wherein each die is mounted on an associated device area;
electrically connecting the dice to selected contacts on their associated device areas;
encapsulating the first surface of the substrate, the dice, the contacts and the electrical connections to form an encapsulation layer; and
sacrificing the semiconductor material of the sacrificial semiconductor wafer after the encapsulation leaving at least portions of the contacts exposed to serve as electrical contacts for their associated dice, wherein the encapsulation material holds the plurality of device areas together after the semiconductor material of the sacrificial semiconductor wafer has been sacrificed, wherein the sacrificing of the sacrificial semiconductor wafer is performed by backgrinding the sacrificial semiconductor wafer through the entirety of the sacrificial substrate and into the surface of the encapsulation layer so that the contacts are exposed.

17. A method of packaging integrated circuits comprising:
providing a substrate formed from a sacrificial semiconductor wafer; the substrate having a first surface that is a substantially planar surface, the a first surface including a plurality of device areas, wherein each device area includes a die attach area and an array of non-solder metallized electrically isolated contacts formed on the substantially planar surface with the array of non-solder metalized electrically isolated contacts not electrically connected to any circuits within the wafer;
attaching a plurality of dice to the substrate, wherein each die is mounted on an associated device area;
electrically connecting the dice to selected contacts on their associated device areas;
encapsulating the first surface of the substrate, the dice, the contacts and the electrical connections; and
sacrificing the semiconductor material of the sacrificial semiconductor wafer after the encapsulation leaving at least portions of the contacts exposed to serve as electrical contacts for their associated dice, wherein the encapsulation material holds the plurality of device areas together after the semiconductor material of the sacrificial semiconductor wafer has been sacrificed, wherein the sacrificing of the sacrificial semiconductor wafer is performed by backgrinding the sacrificial semiconductor wafer to reach at least the first surface such that the sacrificial semiconductor wafer is removed and at least a portion of the contacts are exposed.

* * * * *